(12) United States Patent
Lu et al.

(10) Patent No.: US 8,786,310 B1
(45) Date of Patent: Jul. 22, 2014

(54) PARTIALLY PROGRAMMING AN INTEGRATED CIRCUIT USING CONTROL MEMORY CELLS

(75) Inventors: Weiguang Lu, San Jose, CA (US); Paige A. Kolze, Mountain View, CA (US); William W. Stiehl, Lafayette, CO (US); Robert M. Balzli, Jr., Longmont, CO (US); Carl M. Stern, Boulder, CO (US); Chen W. Tseng, Longmont, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/588,647

(22) Filed: Aug. 17, 2012

(51) Int. Cl.
  *H01L 25/00* (2006.01)
  *H03K 19/173* (2006.01)
  *G06F 7/38* (2006.01)
  *G06F 17/50* (2006.01)

(52) U.S. Cl.
  USPC .............................. 326/41; 326/38; 716/117

(58) Field of Classification Search
  USPC ................. 326/37–41, 47, 101; 716/117, 128
  See application file for complete search history.

(56) References Cited

U.S. PATENT DOCUMENTS

| | | | |
|---|---|---|---|
| 5,946,478 A * | 8/1999 | Lawman .................... | 716/117 |
| 5,991,523 A | 11/1999 | Williams et al. | |
| 6,255,848 B1 | 7/2001 | Schultz et al. | |
| 6,262,596 B1 | 7/2001 | Schultz et al. | |
| 6,493,862 B1 * | 12/2002 | Young et al. .................. | 716/117 |
| 6,526,557 B1 * | 2/2003 | Young et al. .................... | 326/38 |
| 6,907,595 B2 * | 6/2005 | Curd et al. ...................... | 326/41 |
| 7,098,689 B1 | 8/2006 | Tuan et al. | |
| 7,301,822 B1 | 11/2007 | Walstrum, Jr. et al. | |
| 7,562,332 B1 | 7/2009 | Tuan et al. | |
| 7,581,124 B1 | 8/2009 | Jacobson et al. | |
| 7,589,558 B1 | 9/2009 | Tseng et al. | |
| 7,620,926 B1 | 11/2009 | Tuan | |
| 7,973,556 B1 | 7/2011 | Noguera Serra et al. | |
| 8,099,691 B1 | 1/2012 | Tuan et al. | |
| 8,271,924 B1 * | 9/2012 | Orthner et al. ................ | 716/117 |
| 8,415,974 B1 * | 4/2013 | Lysaght ........................... | 326/39 |
| 8,493,091 B2 * | 7/2013 | Sugiyama ....................... | 326/41 |
| 2004/0113655 A1 * | 6/2004 | Curd et al. ...................... | 326/40 |
| 2005/0193358 A1 * | 9/2005 | Blodget et al. ................. | 716/17 |
| 2005/0248364 A1 * | 11/2005 | Vadi et al. ....................... | 326/39 |
| 2009/0219051 A1 * | 9/2009 | Zhang et al. .................... | 326/38 |

OTHER PUBLICATIONS

Hussein, Jameel, et al., Lowering Power at 28 nm with Xilinx 7 Series, White Paper: 7 Series FPGAs, WP389 (v1.1.1.) Feb. 17, 2012, pp. 1-25, Xilinx, Inc., San Jose, California USA.
U.S. Appl. No. 13/588,435, filed Aug. 17, 2012, Tseng, Chen W., et al., Xilinx, Inc., San Jose, California USA.

* cited by examiner

*Primary Examiner* — Alexander H Taningco
*Assistant Examiner* — Dylan White
(74) *Attorney, Agent, or Firm* — LeRoy D. Maunu

(57) ABSTRACT

Approaches for partially reconfiguring a frame are disclosed. In one approach, a circuit arrangement includes programmable resources, frames of configuration memory cells, and partial configuration control memory cells. Each frame includes a plurality of subsets of configuration memory cells, and each subset configures one of the programmable resources. Each partial configuration control memory cell is coupled to a respective one of the subsets. Responsive to a first partial bitstream that includes a quantity of configuration data for all the subsets of configuration cells of a first frame of the plurality of frames, each subset of the configuration memory cells of the first frame is configurable or not configurable responsive to the state of the associated partial configuration control memory cell.

17 Claims, 7 Drawing Sheets

PARTIALLY PROGRAMMING AN INTEGRATED CIRCUIT USING CONTROL MEMORY CELLS

FIELD OF THE INVENTION

One embodiment generally relates to partial configuration and partial reconfiguration of integrated circuits (ICs).

BACKGROUND

Programmable logic devices (PLDs) are a well-known type of programmable integrated circuit (IC) that can be programmed to perform specified logic functions. One type of PLD, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

In some programmable ICs, configuration memory cells are organized by frames for addressing configuration memory cells for purposes of programming and reading back the states of the configuration memory cells. A frame is the smallest quantity of configuration memory cells that can be programmed, and the configuration memory cells of a frame control many tiles of an FPGA. That is, in order to program certain configuration memory cells of a frame, all the configuration memory cells in the frame need to be programmed, which affects all the tiles covered by the frame.

A partially configurable portion of a circuit design refers to one or more modules for which a configuration bitstream can be generated and used to partially configure the FPGA. The remaining modules of the design are not required for the partially configurable portion of the design to be initially implemented on the FPGA. A partially reconfigurable portion of the design refers to one or more modules that have different implementations in separate configuration bitstreams. For a partially reconfigurable portion of the design, the FPGA is configured with a first bitstream to implement a first version of the PR modules. Subsequently, the FPGA is partially reconfigured to implement a second version of the PR modules. A static portion of the circuit design refers to one or more modules that are not subject to partial reconfiguration once implemented on the FPGA. A partially configurable module may be static if it is not subject to partial reconfiguration. The term "partial programming" may be used to refer to partial configuration and partial reconfiguration.

For designs having a module that is subject to partial reconfiguration and/or partial configuration, the implementation of the module must occupy entire frames. A frame of configuration memory cells cannot be programmed to implement both a static part of the design and the partially reconfigurable and/or partially configurable module without causing dynamic logic (e.g., block RAM or lookup table RAM) of the static part of the frame to glitch during reconfiguration.

SUMMARY

In one embodiment, a circuit arrangement comprises: a plurality of programmable resources; a plurality of frames of configuration memory cells coupled to the programmable resources, wherein each frame includes a plurality of subsets of configuration memory cells, and each subset of configuration memory cells of the frame is coupled to one of the programmable resources; a plurality of partial configuration control memory cells, wherein each partial configuration control memory cell is coupled to a respective one of the subsets of configuration memory cells; and wherein responsive to a first partial bitstream that includes a quantity of configuration data for all the subsets of configuration cells of a first frame of the plurality of frames, responsive to the partial configuration control memory cell associated with one subset of the subsets of configuration memory cells of the first frame being in a second state, and responsive to the partial configuration control memory cells associated with other subsets of configuration memory cells of the first frame being in a first state, the one subset of configuration memory cells of the first frame is configurable with data from the first partial bitstream, and the other subsets of configuration memory cells of the first frame are not configurable with data from the first partial bitstream.

In another embodiment, a method of generating an implementation of a circuit design for an integrated circuit (IC) comprises: placing a first function of the circuit design on a first subset of programmable resources of the IC and a second function of the circuit design on a second subset of the programmable resources; generating a first configuration bitstream having configuration data that configures each subset of configuration memory cells of the IC that are coupled to the first subset of programmable resources to implement the first function; generating a second configuration bitstream having configuration data that configures each subset of configuration memory cells coupled to the second subset of programmable resources to implement the second function; wherein at least one of the subsets of configuration memory cells that are coupled to the first subset of programmable resources and at least one of the subsets of configuration memory cells that are coupled to the second subset of programmable resources are included in one frame of a plurality of frames of the configuration memory cells of the IC; and generating a third configuration bitstream that programs to a first state, a partial reconfiguration control memory cell associated with the at least one of the subsets of configuration memory cells that are coupled to the first subset of programmable resources, wherein the first state enables programming of the at least one of the subsets of configuration memory cells.

In another embodiment, a method of operating an integrated circuit (IC) comprises: inputting an initial bitstream that includes configuration data for one or more frames of configuration memory cells of the IC and configuration data that configures partial configuration control memory cells of the IC into a first state; programming the one or more frames of configuration memory cells with the initial bitstream; operating the IC as configured with the initial bitstream; in response to a reconfiguration trigger signal, configuring to a second state one of the partial configuration control memory cells associated with one subset of a plurality of subsets of configuration memory cells of one frame of the one or more frames of configuration memory cells; inputting a first partial bitstream that includes configuration data for at least the one frame of the one or more frames of configuration memory cells, wherein the first partial bitstream includes a quantity of configuration data for the plurality of subsets of configuration cells of the one frame; enabling programming of the one subset of configuration memory cells with configuration data from the first partial bitstream in response to the associated partial configuration control memory cell being in the second state; and programming the one subset of configuration memory cells with configuration data from the first partial bitstream.

Other embodiments will be recognized from consideration of the Detailed Description and Claims, which follow.

BRIEF DESCRIPTION OF THE DRAWINGS

Various aspects and advantages of the disclosed embodiments will become apparent upon review of the following detailed description and upon reference to the drawings in which.

DETAILED DESCRIPTION OF THE DRAWINGS

Figure 1:
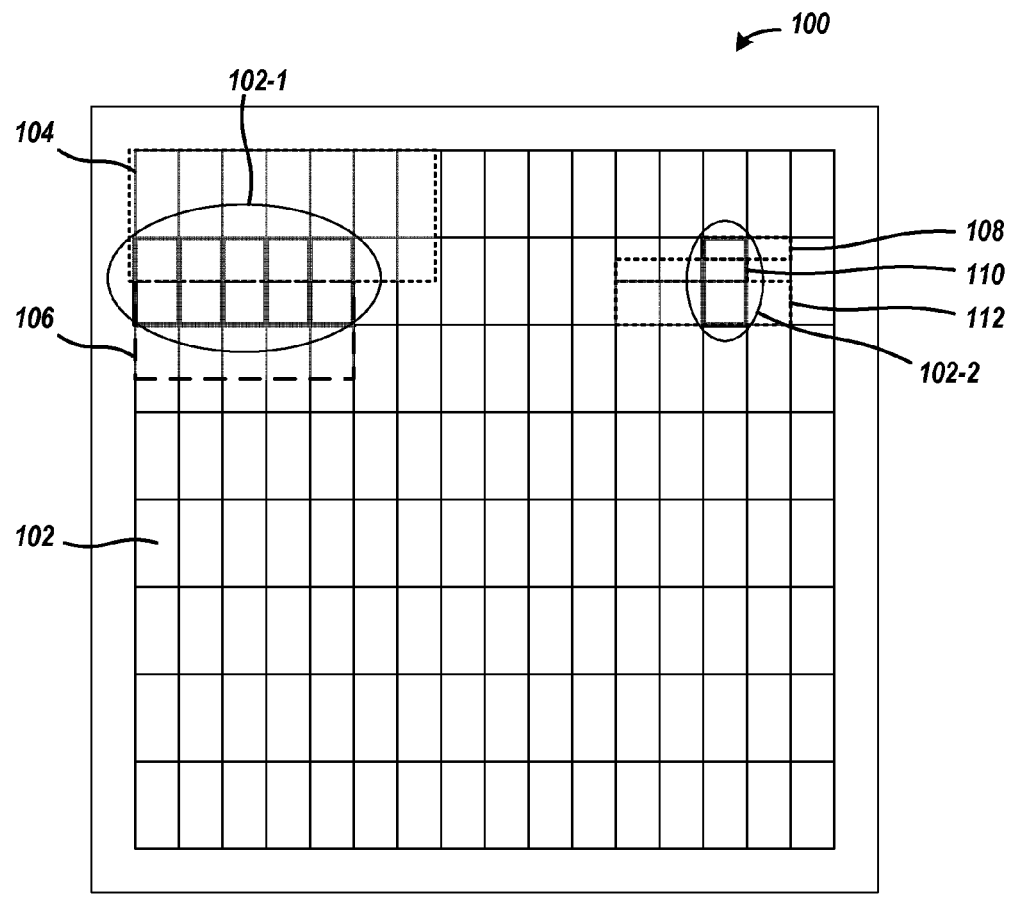
FIG. 1 shows an example programmable IC in which frames are configured with configuration data that implements different combinations of partially configurable, partially reconfigurable, and static portions of the design.

In current FPGAs, global signal control (GSC) can be exerted at the frame level. That is, a global control signal, such as program, global set/reset (GSR) or global write-enable (GWE), can be controlled over individual frames. Each frame has a configuration memory cell whose state can be used to control whether or not the state of the global control signal will affect resources in the frame.

GSC at the frame level creates various problems for partially reconfigurable and partially configurable designs. GSC at the frame level causes dynamic logic of the static area to glitch and registers of the reconfigurable area to not be initialized correctly. Current solutions to these two issues may cause undesirable routing congestion, wire lengths and algorithm run time. In addition, the current solutions may lead to difficulties with timing closure, failure to find a routing solution, failure to find a placement solution and excessive clock resource usage.

GSC at the frame level does not allow more than one partial reconfiguration/partial configuration region per frame. Current solutions to this problem cause larger than needed partial reconfiguration/partial configuration partial bitstreams, which leads to slower reprogram time for partial reconfiguration and slower initial boot times for partial configuration. In addition, the current solutions may lead to interlacing of partial reconfiguration and partial configuration regions to obtain scarce resources. This leads to lower device utilization, higher routing congestion, longer wire lengths and longer algorithm run time. The current solutions may lead to difficulties with timing closure, failure to find a routing solution and excessive clock resource usage.

GSC at the frame level allows for static routing within a partial bitstream but prevents some static logic from being included within a partial bitstream. This forces the RTL of a design to be device dependent. In addition, this issue complicates programming a partial bitstream over special configuration ports such as PCIe or Ethernet and complicates programming an individual die in the case of stacked dies.

GSC at the frame level prevents users from partially reconfiguring a part of the device that has already been partially configured. These problems are addressed by providing GSC at the tile level.

A tile includes one or more programmable resources of the programmable IC. A frame of configuration memory cells is configurable to program multiple tiles. The subset of configuration memory cells used to program a tile includes a configuration memory cell whose state controls whether or not the subset of configuration memory cells can be programmed for partial reconfiguration or partial configuration. Thus, with tile-level control over the effects of GSC, a frame of configuration memory cells can be programmed to implement both a static part of the design and a partial reconfiguration/partial configuration module.

Tile-level control over the effects of GSC also allows a frame of configuration memory cells to implement separate modules that are subject to partial reconfiguration and/or partial configuration. Similarly, a frame may be programmed with configuration data that implements a combination of a static module, a partial reconfiguration module, and a partial configuration module. Since the configuration data for a module need not occupy an entire frame of configuration memory cells, placement and routing may be improved, and the size of partial bitstreams may be reduced, thereby reducing partial configuration initial boot times and/or partial reconfiguration programming time. In addition, the aforementioned issues associated with GSC at the frame level are also alleviated.

Different embodiments relate to generating an implementation of a circuit design on a programmable integrated circuit (IC) and to operating a programmable integrated circuit (IC). The programmable IC has a plurality of programmable resources and a plurality of frames of configuration memory cells. Each of the programmable resources is coupled to a respective subset of the configuration memory cells, and each frame includes a plurality of the subsets of the configuration memory cells. Each subset of the configuration memory cells has an associated partial configuration control memory cell. Different logic portions of the circuit design both program one frame, and separate bitstreams are generated to program the different portions of the frame.

In another embodiment, a method is provided for operating a programmable IC. The method generally includes configuring one or more frames of configuration memory cells of the programmable IC with an initial bitstream. The programmable IC is then operated with the initial bitstream. In response to a reconfiguration trigger signal, the partial reconfiguration control memory cell that is associated with one subset of configuration memory cells of one frame of the one or more frames of configuration memory cells is cleared. The clearing of the partial reconfiguration control memory cell allows that subset of configuration memory cells to be reconfigured. With the partial reconfiguration control memory cells remaining set for other subsets of configuration memory cells in the frame, a frame of configuration data directed to that frame will not affect the state of the memory cells in those other subsets. After the selected partial reconfiguration control memory cells have been cleared, the associated configuration memory cells are reconfigured with a partial bitstream. Though the partial bitstream includes a quantity of data for all the configuration memory cells in the frame, only those configuration memory cells for which the partial reconfiguration control memory cells are cleared are programmed.

With one or more embodiments of the present invention, static logic need not be placed in frames that do not contain partial reconfiguration or partial configuration logic. Rather, any combination of static logic, partial reconfiguration logic, and partial configuration logic may be placed in the same frame. This permits partial reconfiguration of tiles of a frame that were partially configured with an initial bitstream. It will be appreciated that global signal control may be moved down to the sub-tile level in other embodiments. For example, in some FPGAs, the global signal control may be at the slice level, which is the smallest logic element in an FPGA device.

FIG. 1 shows an example programmable IC in which frames are configured with configuration data that implements different combinations of partially configurable, partially reconfigurable, and static portions of the design. In this specification, frame refers to a group of configuration memory cells, and a tile or subcircuit refers to the circuitry that is controlled by the states of a subset of configuration memory cells of a frame. Example tiles of a particular FPGA are described in association with FIG. 7, and general subcircuits are described in association with FIG. 4.

The programmable IC 100 includes configuration memory cells (not individually shown) that are organized into frames. Block 102 represents one of the frames. The states of the configuration memory cells of a frame specify the functions of multiple tiles (not shown) that are associated with the frame.

In one example, certain ones of the frames are shared by two parts of the circuit design. One part of the design is shown as dashed block 104, and the other part of the design is shown as dashed block 106. Frames 102-1 (the group of bold lined blocks) are occupied by the two portions of the design that are represented by blocks 104 and 106. One part of the design may be a partially reconfigurable, partially configurable, or static part of the design, and the other part may be a partially reconfigurable or partially configurable part of the design.

In one scenario, the programmable IC 100 may be initially partially configured with the portion of the design represented by block 104. The programmable IC may then be operated as configured with the initial bitstream. At a later time, the programmable IC may be partially reconfigured with another partial bitstream to include the portion of the design represented by block 106. The frames 102-1 are partially reconfigurable with the relevant portions of the second partial bitstream, and the portions of frames 102-1 that were previously programmed with the initial partial bitstream are undisturbed by the programming with the second partial bitstream.

In another example, a frame may be shared by more than two parts of a design. For example, a frame may be shared by any combination of static, partial configuration, and partial reconfiguration parts of the design. Frame 102-2 (the single bold lined block) is shared by three parts of the design, which are represented as dashed blocks 108, 110, and 112. A frame may be shared by more than three parts of a design depending on the circuit design, the resources controlled by a frame, and the granularity of global signal control over the resources of a frame.

Figure 2:
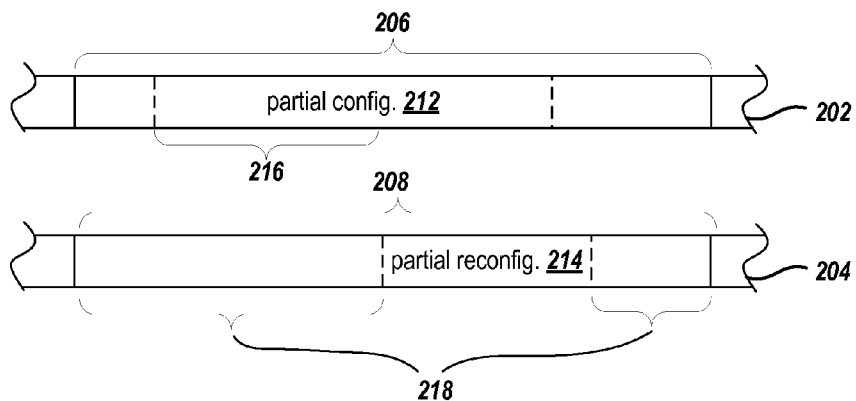
FIG. 2 shows portions of two example bitstreams.

FIG. 2 shows portions of two example bitstreams 202 and 204. Each portion shows configuration data for a frame of configuration memory. The example bitstreams correspond to a scenario in which a programmable IC is partially configured with an initial bitstream (e.g., 202) and sometime later partially reconfigured with bitstream 204. One of the frames of the programmable IC is initially partially configured with bitstream 202, and that same frame is subsequently partially reconfigured with bitstream 204.

Configuration data 206 of bitstream 202 includes data for one frame of configuration memory, and configuration data 208 of bitstream 204 includes data for that same frame of configuration memory. Configuration data 206 of bitstream 202 includes partial configuration data 212 for partially configuring a frame. Configuration data 208 of bitstream 204 includes partial reconfiguration data 214 for partially reconfiguring the same frame.

The relative positions of partial configuration data 212 within configuration data 206 and partial reconfiguration data 214 within configuration data 208 are representative of the particular memory cells of the frame to be programmed with the bitstreams. Thus, the portion of the frame to be configured with partial configuration data 212 overlaps the portion of the frame to be reconfigured with partial reconfiguration data 214.

In partially reconfiguring the programmable IC with the bitstream 204, reconfiguration control memory cells (see FIG. 4) of the frame are used to control which portions of the frame are reconfigured. Thus, in order to prevent reconfiguring the portion of the frame that was initially programmed with configuration data 216 of bitstream 202 with partial reconfiguration data 214, one or more reconfiguration control memory cells associated with that portion are cleared. The clearing of the reconfiguration control memory cells serves to mask a global signal that enables programming. It will be appreciated that in alternative embodiments, the logic may be reversed and the reconfiguration control memory cells may be set to enable programming and cleared to disable programming.

Since addressing of the configuration memory is by frame address, the configuration bitstreams include configuration data sufficient for entire frames even though only parts of some frames may be programmed. Thus, the bitstreams may include filler data for frames that are partially configured or partially reconfigured. The filler data may be all logic 0 or logic 1 values, which allows for compression in the storage of the bitstreams. The compressed data may be expanded in the programmable IC when the bitstream is input. Bitstream 204 is shown as including filler data 218 to provide a full frame of configuration data along with partial reconfiguration data 214.

Figure 3:
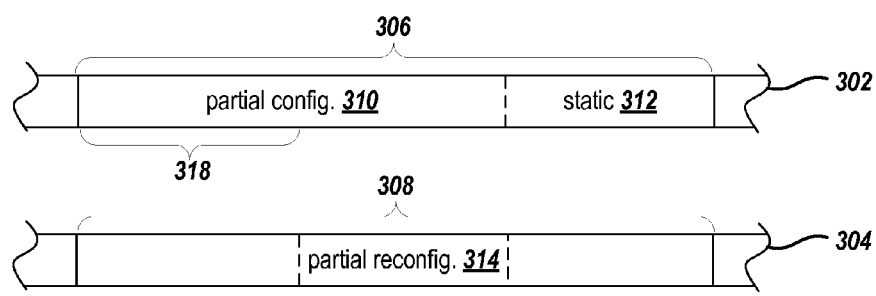
FIG. 3 shows three example bitstreams in which a first bitstream includes configuration data for a frame, and a second bitstream and a third bitstream include configuration data for partially reconfiguring that same frame.

FIG. 3 shows three example bitstreams in which a first bitstream 302 includes configuration data for a frame, and a second bitstream 304 and a third bitstream 305 include configuration data for partially reconfiguring that same frame. The example bitstreams correspond to a scenario in which a programmable IC is partially configured with an initial bitstream 302, sometime later partially reconfigured with bitstream 304, and sometime later still partially reconfigured with bitstream 305. One of the frames of the programmable IC is initially configured with configuration data 306 of bitstream 302, that same frame is subsequently partially reconfigured with configuration data 308 of bitstream 304, and later the frame is partially reconfigured with configuration data 309 of bitstream 305.

Configuration data 306 of bitstream 302 includes data for one frame of configuration memory, and configuration data 308 of bitstream 304 includes data for that same frame of configuration memory. Configuration data 306 of bitstream 302 includes partial configuration data 310 and static configuration data 312 for configuring a frame. Configuration data 308 of bitstream 304 includes partial reconfiguration data 314 for partially reconfiguring the same frame. The portion of the frame to be configured with partial configuration data 310 overlaps the portion of the frame to be partially reconfigured with partial reconfiguration data 314. Configuration data 309 of bitstream 305 includes partial reconfiguration data 316 for partially reconfiguring the same part of the frame as partial reconfiguration data 314 of bitstream 304.

In partially reconfiguring the programmable IC with the bitstream 304, reconfiguration control memory cells of the frame are used to control which portions of the frame are reconfigured. Thus, in order to prevent reconfiguring the portion the frame that was initially programmed with configuration data 318 and static configuration data 312 of bitstream 302 with partial reconfiguration data 314, the reconfiguration control memory cells associated with those portions are set.

Figure 4:
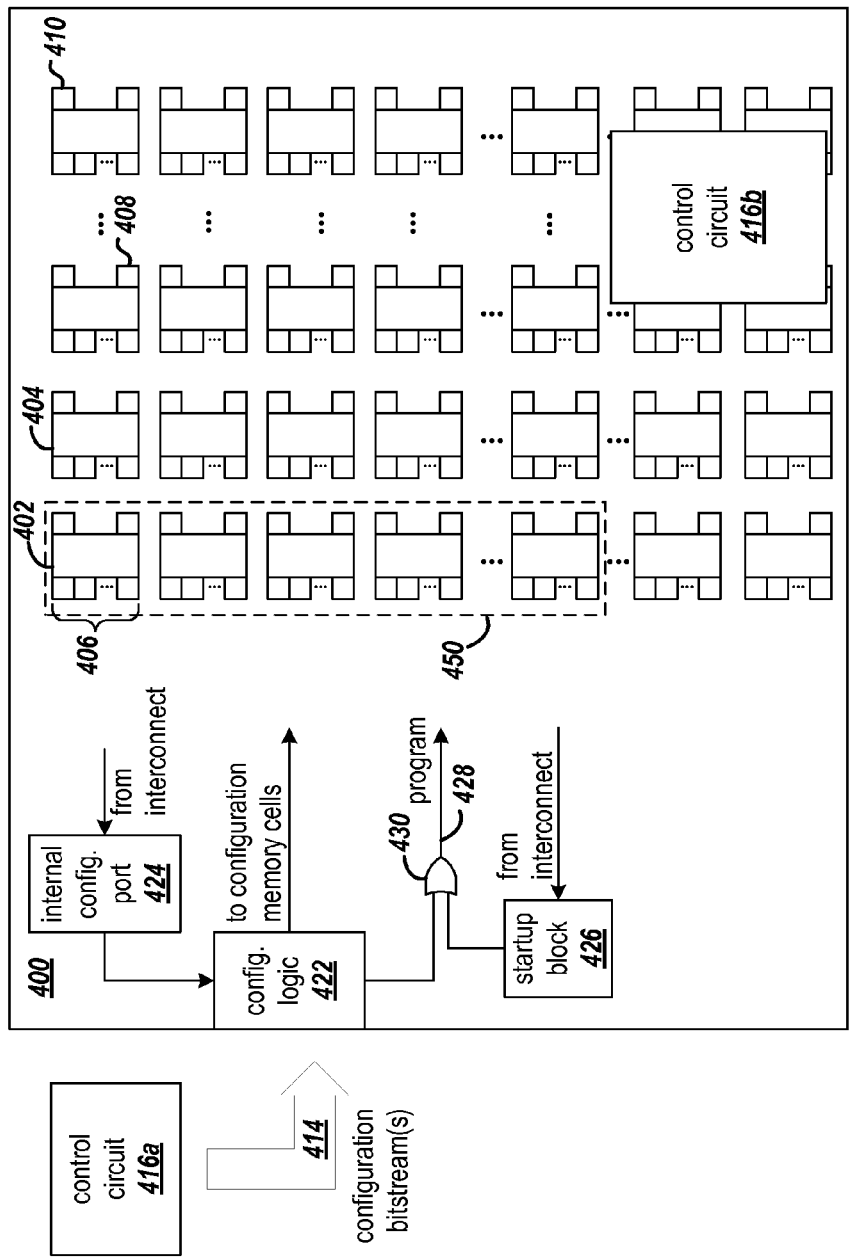
FIG. 4 shows an example of a programmable integrated circuit having multiple sub-circuits (e.g., tiles of an FPGA which may include programmable logic)

FIG. 4 shows an example of a programmable integrated circuit 400 having multiple sub-circuits (e.g., tiles of an FPGA which may include programmable logic). Blocks 402 and 404 are examples of the sub-circuits or tiles. Each sub-circuit has an associated set of configuration memory cells. For example, sub-circuit 402 is associated with configuration memory cells 406. For some types of sub-circuits, the states of the configuration memory cells specify the logic function of the associated sub-circuit. For other sub-circuits, the states of the configuration memory cells provide operating parameters for the associated sub-circuit.

Each sub-circuit also has an associated GWE mask configuration memory cell, such as memory cell 408, and a partial reconfiguration mask configuration memory cell, such as memory cell 410. The function of the GWE mask configuration memory cell is described further in co-pending U.S. patent application Ser. No. 13/588,435, by Chen Wei Tseng et al., which was filed on Aug. 17, 2012.

The partial reconfiguration mask configuration memory cell 410 (also referenced herein as a partial reconfiguration control memory cell herein) can be used to mask the effect of partial reconfiguration on configuration memory cells associated with the sub-circuit. That is, if the partial reconfiguration mask configuration memory cell is set, programming of the configuration memory cells associated with the sub-circuit is disabled and those configuration memory cells cannot be reconfigured even if addressed by a configuration bitstream. If the partial reconfiguration mask configuration memory cell is cleared, programming of the configuration memory cells associated with the sub-circuit is enabled and those configuration memory cells can be reconfigured if addressed by a configuration bitstream.

Dashed block 450 illustrates one frame of configuration memory cells and the associated subcircuits/tiles. One or more embodiments of the present invention permit partial configuration and partial reconfiguration of subsets of configuration memory cells of a frame. That is, with partial configuration or partial reconfiguration, the entire frame need not be configured. The partial reconfiguration mask configuration memory cells may be used to protect sensitive circuits (e.g., analog circuits) in scenarios in which all the configuration memory cells need to be programmed and an intermediate memory cell configuration would damage the sensitive circuit.

Two approaches are disclosed for partially configuring/reconfiguring the programmable IC. In one approach, very small and highly compressible partial reconfiguration bitstreams 414 may be input by control circuit 416a to configure the partial reconfiguration mask configuration memory cell (s) into the desired state and assert the program signal. Control circuit 416a is implemented external to the programmable IC 400. For example, the control circuit 416a may be on a separate die or package from the programmable IC 400. In another approach, a control circuit 416b implemented on the programmable IC can be used to provide partial configuration/reconfiguration bitstreams to configure the partial reconfiguration mask configuration memory cell(s) into the desired states and assert the program signal.

With the first approach, configuration bitstreams are input to the configuration logic 422 for configuring configuration memory cells of the programmable IC. An initial configuration bitstream partially configures the programmable IC by programming selected configuration memory cells (e.g., 406) into desired states for implementing a circuit design. The configuration memory cells that are associated with all the sub-circuits needed to implement the circuit design (or a portion thereof) are configured. Once the desired configuration memory cells are programmed, the initial configuration bitstream may also configure the partial reconfiguration mask configuration memory cells (e.g., 410) of the sub-circuits into a state that masks the effect of the program signal on line 428. While an implemented design, or a portion thereof, is operating in the programmable IC, and in response to a triggering condition (as would vary from application to application), the control circuit 416a inputs a small and highly compressible partial reconfiguration bitstream to clear selected partial reconfiguration mask configuration memory cells. The clearing of the partial reconfiguration mask configuration memory cells enables programming of the associated configuration memory cells. The control circuit 416a then inputs a partial reconfiguration bitstream to reconfigure the selected configuration memory cells.

In the second approach, a control circuit 416b implemented on the programmable IC can be used to provide partial reconfiguration (PR) bitstreams to configure the PR mask configuration memory cells into the desired states and input the partial reconfiguration bitstream. The control circuit may be implemented on either an embedded processor or in programmable logic of the programmable IC.

The control circuit 416b is coupled to an internal configuration port 424 via programmable interconnect (not shown) of the programmable IC, and the internal configuration port is coupled to the configuration logic. Via the programmable interconnect, the control circuit provides partial reconfiguration bitstreams to the internal configuration port and configuration logic to set and clear the states of one or more partial reconfiguration mask configuration memory cells.

Programmable IC 400 further includes a startup block circuit 426. In some programmable ICs, such as some FPGAs from Xilinx, the startup block provides application circuitry with access to the various functions that are available during the startup phase of the device's operation, including the GWE, GSR and GTS signals. The startup block may be a small cell whose pins are accessible via connections to the programmable interconnect. Connecting a signal to a pin of the start-up block introduces that signal to the appropriate global network on the programmable IC. The program signal on line 428 may be controlled via configuration logic 422 or startup block 426 as shown by OR gate 430.

Figure 5:
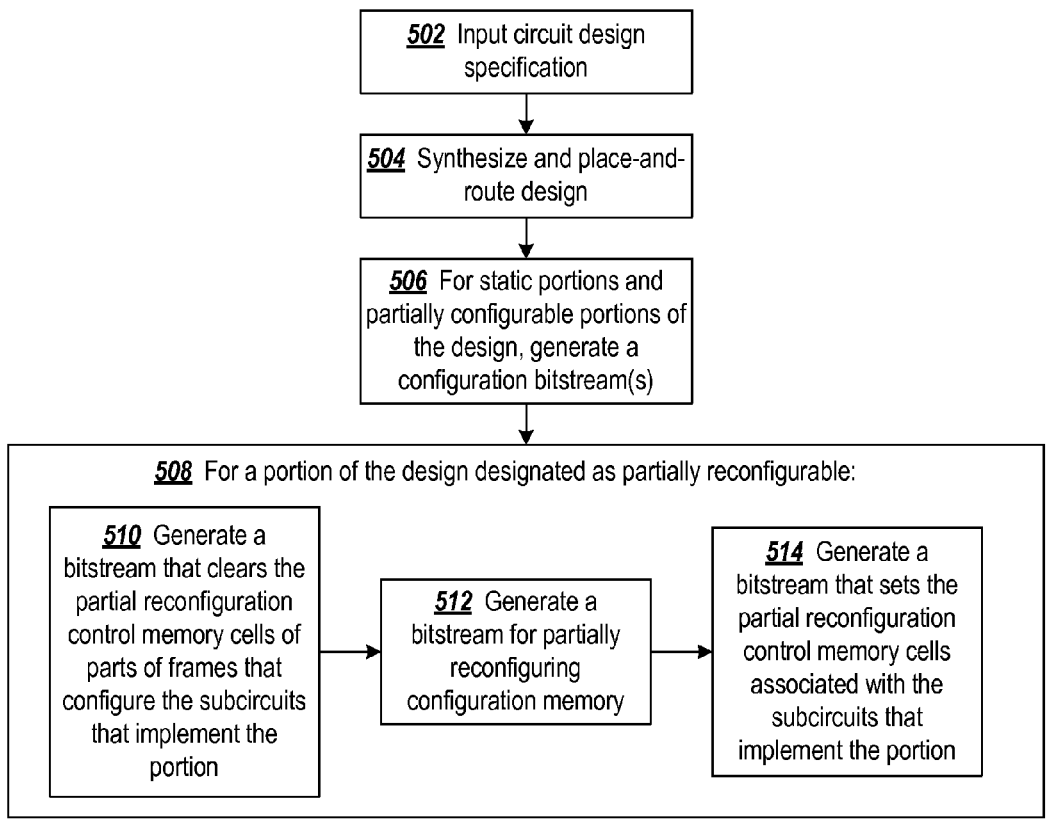
FIG. 5 is a flowchart of a process for generating bitstreams for partial configuration and/or partial reconfiguration of portions of frames.

FIG. 5 is a flowchart of a process for generating bitstreams for partial configuration and/or partial reconfiguration of portions of frames. At block 502 a circuit design specification is input, and the design is synthesized and placed-and-routed at block 504. With partial configuration and partial reconfiguration being controllable at the tile level, static portions, partial configuration portions, and partial reconfiguration portions of the design may be placed in the same frames.

For static portions and partial configuration portions of the design, one or more configuration bitstreams are generated at block 506. The static portions and partial configuration portions may be in the same or separate bitstreams depending on application requirements. In one embodiment, the bitstream includes configuration data to initialize the reconfiguration control memory cells to a set state to disable unintended programming.

At block 508, configuration bitstreams are generated for partial reconfiguration portions of the design. In one embodiment, three bitstreams are generated. At block 510, a bitstream is generated that clears the partial reconfiguration control memory cells that are associated with the parts of the frames to be reconfigured. The partial reconfiguration control memory cells in a cleared state enable reconfiguration of the associated configuration memory cells.

At block 512, a configuration bitstream is generated for partially reconfiguring the configuration memory to implement the partial reconfiguration portion of the design. In one embodiment, the bitstream includes configuration data for reconfiguring part of a frame as shown in FIGS. 2 and 3. Filler data is included in the bitstream for portions of frames that are not reconfigured.

At block 514, a third bitstream is generated. The third bitstream sets the partial reconfiguration control memory cells that are cleared in the first bitstream which was generated at block 510. The third bitstream can be used after reconfiguration is complete to disable unintended reconfiguration of the configuration memory cells associated with the set reconfiguration control memory cells.

Figure 6:
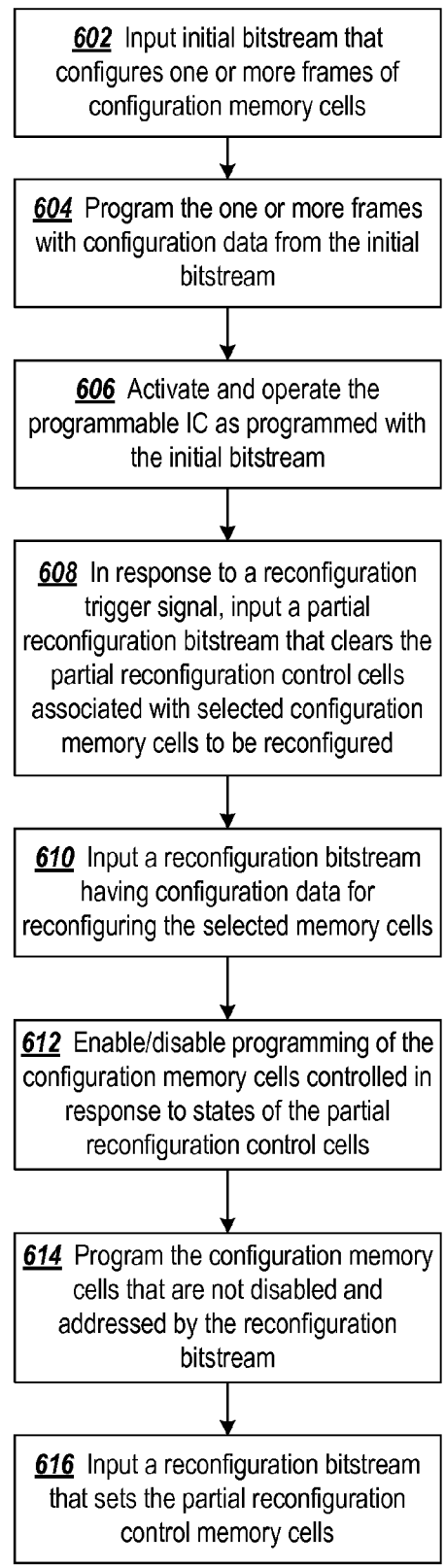
FIG. 6 is a flowchart of an example process for partially reconfiguring a portion of a frame while maintaining the programmed state of the remainder of a frame.

FIG. 6 is a flowchart of an example process for partially reconfiguring a portion of a frame while maintaining the programmed state of the remainder of a frame.

At block 602, an initial configuration bitstream is input to a programmable IC. The initial configuration bitstream contains configuration data for programming one or more frames of configuration memory cells. One or more of the frames may be partially configured with data and others may be completely configured. At block 604, the addressed frames of the programmable IC are programmed with data from the initial bitstream. The programmable IC is then activated and operated according to the portion of the design configured on the programmable IC at block 606.

In response to a reconfiguration trigger signal at block 608, partial reconfiguration is initiated. At block 608, a first partial reconfiguration bitstream is input to the programmable IC to clear the state of the partial reconfiguration control memory cells associated with the parts of the programmable IC to be reconfigured. For one or more of the frames of the programmable IC, the first partial reconfiguration bitstream includes configuration data that clears one or more of the partial reconfiguration control memory cells of the frame and leaves set others of the partial reconfiguration control memory cells of the frame.

At block 610, a second partial reconfiguration bitstream is input to the programmable IC. The partial reconfiguration bitstream includes configuration data for implementing a portion of the design on the programmable IC. For one or more of the frames of the programmable IC, the second partial reconfiguration bitstream includes configuration data used to configure certain ones of the configuration memory cells of the frame and filler data that corresponds to others of the configuration memory cells of the frame.

At block 612, in response to the states of the partial reconfiguration control memory cells, programming of the configuration memory cells is either enabled or disabled. In particular, the configuration memory cells associated with the partial reconfiguration control memory cells that were cleared at block 608 are enabled for programming, and programming of all other configuration cells is disabled. At block 614, the configuration memory cells enabled for programming are programmed with configuration data from the bitstream.

A third partial reconfiguration bitstream is input at block 616. The third partial reconfiguration bitstream sets the partial reconfiguration control memory cells that were cleared at block 608.

Figure 7:
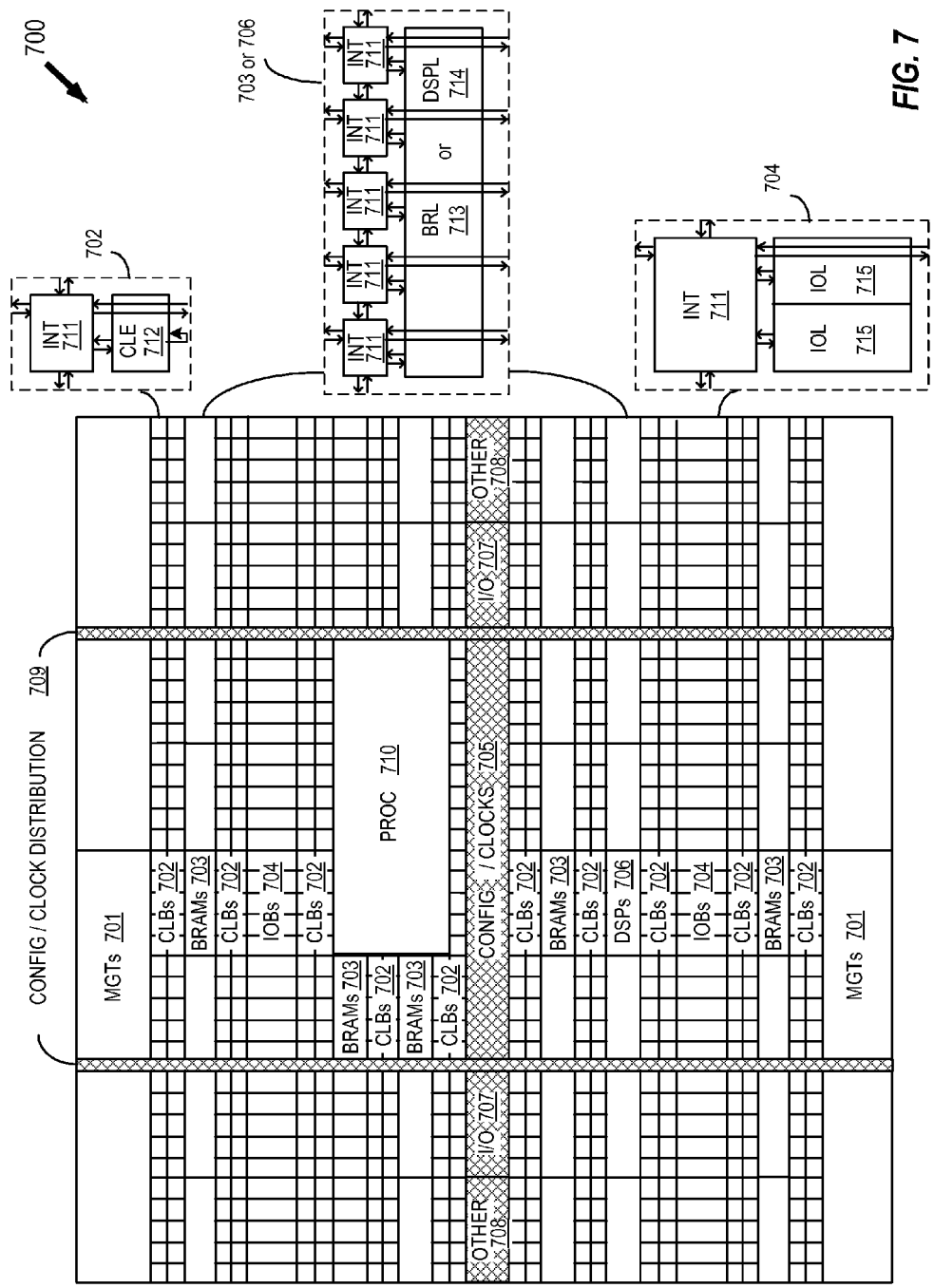
FIG. 7 is an example FPGA that may be partially configured and reconfigured in accordance with one or more embodiments of the invention.

FIG. 7 is an example FPGA that may be partially configured and reconfigured in accordance with one or more embodiments of the invention. FPGAs can include several different types of programmable logic blocks in the array. For example, FIG. 7 illustrates an FPGA architecture (700) that includes a large number of different programmable tiles, including multi-gigabit transceivers (MGTs 701), configurable logic blocks (CLBs 702), random access memory blocks (BRAMs 703), input/output blocks (IOBs 704), configuration and clocking logic (CONFIG/CLOCKS 705), digital signal processing blocks (DSPs 706), specialized input/output blocks (I/O 707), e.g., clock ports, and other programmable logic 708 such as digital clock managers, analog-to-digital converters, system monitoring logic, and so forth. Some FPGAs also include dedicated processor blocks (PROC 710) and internal and external reconfiguration ports (not shown).

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element INT 711 also includes the connections to and from the programmable logic element within the same tile, as shown by the examples included at the top of FIG. 7.

For example, a CLB 702 can include a configurable logic element CLE 712 that can be programmed to implement user logic plus a single programmable interconnect element INT 711. A BRAM 703 can include a BRAM logic element (BRL 713) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 706 can include a DSP logic element (DSPL 714) in addition to an appropriate number of programmable interconnect elements. An IOB 704 can include, for example, two instances of an input/output logic element (IOL 715) in addition to one instance of the programmable interconnect element INT 711. As will be clear to those of skill in the art, the actual I/O pads connected, for example, to the I/O logic element 715 are manufactured using metal layered above the various illustrated logic blocks, and typically are not confined to the area of the input/output logic element 715.

In the pictured embodiment, a columnar area near the center of the die (shown shaded in FIG. 7) is used for configuration, clock, and other control logic. Horizontal areas 709 extending from this column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual FPGA, more than one adjacent column of CLBs is typically included wherever the CLBs appear, to facilitate the efficient implementation of user logic.

Figure 8:
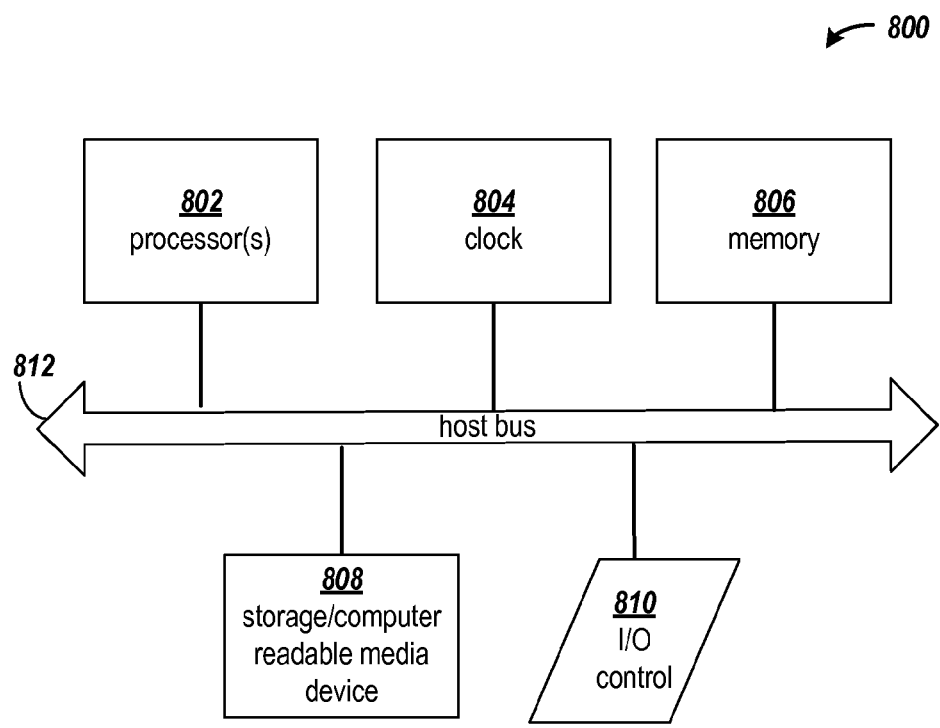
FIG. 8 shows a block diagram of an example computing arrangement that may be configured to implement one or more of the processes described herein.

FIG. 8 shows a block diagram of an example computing arrangement that may be configured to implement one or more of the processes described herein. It will be appreciated that various alternative computing arrangements, including one or more processors and a memory arrangement configured with program code, would be suitable for hosting the processes and data structures and implementing the algorithms of the different embodiments. The computer code, comprising the processes of one or more embodiments encoded in a processor executable format, may be stored and provided via a variety of computer-readable storage media or delivery channels such as magnetic or optical disks or tapes, electronic storage devices, or as application services over a network.

Processor computing arrangement 800 includes one or more processors 802, a clock signal generator 804, a memory unit 806, a storage unit 808, and an input/output control unit 810, all coupled to a host bus 812. The arrangement 800 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 802 may be one or more general purpose processors, or a combination of one or more general purpose processors and suitable co-processors, or one or more specialized processors (e.g., RISC, CISC, pipelined, etc.).

The memory arrangement 806 typically includes multiple levels of cache memory, and a main memory. The storage arrangement 808 may include local and/or remote persistent storage, such as provided by magnetic disks (not shown), flash, EPROM, or other non-volatile data storage. The storage unit may be read or read/write capable. Further, the memory 806 and storage 808 may be combined in a single arrangement.

The processor arrangement 802 executes the software in storage 808 and/or memory 806, reads data from and stores data to the storage 808 and/or memory 806, and communicates with external devices through the input/output control arrangement 810. These functions are synchronized by the clock signal generator 804. The resource of the computing arrangement may be managed by either an operating system (not shown), or a hardware control unit (not shown).

The embodiments are thought to be applicable to a variety of systems for partial configuration and partial reconfiguration of programmable integrated circuits. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope of the invention being indicated by the following claims.

What is claimed is:

1. A circuit, comprising:
   a plurality of programmable resources;
   a plurality of frames of configuration memory cells coupled to the programmable resources, wherein each frame includes a plurality of subsets of configuration memory cells, and each subset of configuration memory cells of the frame is coupled to one of the programmable resources;
   a plurality of partial configuration control memory cells, wherein each partial configuration control memory cell is coupled to a respective one of the subsets of configuration memory cells; and
   wherein responsive to a first partial bitstream that includes a quantity of configuration data for all the subsets of configuration cells of a first frame of the plurality of frames, responsive to the partial configuration control memory cell associated with one subset of the subsets of configuration memory cells of the first frame being in a second state, and responsive to the partial configuration control memory cells associated with other subsets of configuration memory cells of the first frame being in a first state, the one subset of configuration memory cells of the first frame is configurable with data from the first partial bitstream, and the other subsets of configuration memory cells of the first frame are not configurable with data from the first partial bitstream.

2. The circuit of claim 1, further comprising:
   a configuration control circuit coupled to the plurality of frames of configuration memory cells, wherein the configuration control circuit is configured to:
   configure one or more of the frames of configuration memory cells with configuration data from an initial bitstream and configure the partial configuration control memory cells into the first state with configuration data from the initial bitstream;
   operate the plurality of programmable resources with the configuration memory cells configured with the initial bitstream;
   in response to a reconfiguration trigger signal, configure to the second state the partial configuration control memory cell associated with one of the subsets of configuration memory cells of one frame of the one or more frames of configuration memory cells; and
   input a second partial bitstream that includes a quantity of configuration data for all the subsets of configuration cells of the one frame.

3. The circuit of claim 2, wherein the configuration control circuit is further configured to:
   after the input of the second partial bitstream and configuration of the one subset of configuration memory cells with configuration data from the second partial bitstream, input a third partial bitstream that includes configuration data that programs to the first state, the partial reconfiguration control memory cell associated with the one subset of the one frame.

4. The circuit of claim 2, wherein:
the configuration with the initial bitstream includes configuring a first subset of configuration memory cells of the one frame, the first subset including fewer than all of the configuration memory cells of the one frame; and
the one subset not including any configuration memory cells of the one frame programmed by the first subset of configuration memory cells.

5. The circuit of claim 2, wherein:
the configuration with the initial bitstream includes configuring a first subset of configuration memory cells of the one frame, the first subset including fewer than all of the configuration memory cells of the one frame; and
the one subset including configuration memory cells of the one frame programmed by the first subset of configuration memory cells.

6. The circuit of claim 5, wherein the configuration control circuit is further configured to:
input a third partial bitstream that includes a quantity of configuration data for all the subsets of configuration cells of the one frame, and the quantity of configuration data configures only the one subset of configuration memory cells in the one frame in response to the partial configuration control memory cell associated with the one subset being in the second state and the partial configuration control memory cells associated with other subsets of configuration memory cells in the one frame being in the first state.

7. The circuit of claim 2, wherein:
the initial bitstream configures all of the configuration memory cells of the one frame; and
the one subset of configuration memory cells of the one frame does not include all of the configuration memory cells of the one frame.

8. The circuit of claim 2, wherein the second partial bitstream includes filler data for configuration memory cells not in the one subset of the one frame.

9. The circuit of claim 2, wherein the configuration control circuit and the configuration memory cells are on physically separate integrated circuit chips.

10. A method of generating an implementation of a circuit design for an integrated circuit (IC), comprising:
placing a first function of the circuit design on a first subset of programmable resources of the IC and a second function of the circuit design on a second subset of the programmable resources;
wherein the first function is a partial configuration portion of the design, the second function is a partial reconfiguration portion of the design, and the second subset of programmable resources intersects the first subset of programmable resources;
generating a first configuration bitstream having configuration data that configures each subset of configuration memory cells of the IC that are coupled to the first subset of programmable resources to implement the first function;
generating a second configuration bitstream having configuration data that configures each subset of configuration memory cells coupled to the second subset of programmable resources to implement the second function;
wherein at least one of the subsets of configuration memory cells that are coupled to the first subset of programmable resources and at least one of the subsets of configuration memory cells that are coupled to the second subset of programmable resources are included in one frame of a plurality of frames of the configuration memory cells of the IC; and
generating a third configuration bitstream that programs to a first state, a partial reconfiguration control memory cell associated with the at least one of the subsets of configuration memory cells that are coupled to the first subset of programmable resources, wherein the first state enables programming of the at least one of the subsets of configuration memory cells.

11. The method of claim 10, wherein:
the first function includes a partial configuration portion of the design and a static portion of the design;
the partial configuration portion of the design is placed on a first portion of the first subset of the programmable resources, and the static portion of the design is placed on a second portion of the first subset of the programmable resources;
the second function is a partial reconfiguration portion of the design; and
the second subset of programmable resources intersects the first portion of the first subset of programmable resources.

12. The method of claim 10, wherein the first configuration bitstream includes filler data for a plurality of configuration memory cells of the one frame.

13. The method of claim 12, wherein the second configuration bitstream includes filler data for a plurality of configuration memory cells of the one frame.

14. The method of claim 10, further comprising generating a fourth configuration bitstream that programs to a second state, the partial reconfiguration control memory cell associated with the at least one of the subsets of configuration memory cells that are coupled to the first subsets of programmable resources, wherein the second state disables programming of the at least one of the subsets of configuration memory cells.

15. A method of operating an integrated circuit (IC), comprising:
inputting an initial bitstream that includes configuration data for one or more frames of configuration memory cells of the IC and configuration data that configures partial configuration control memory cells of the IC into a first state, wherein each frame of the one or more frames includes a plurality of subsets of configuration memory cells, and each subset of configuration memory cells of the frame is coupled to one of the programmable resources, and each subset of configuration memory cells is coupled to a respective partial configuration control memory cell;
programming the one or more frames of configuration memory cells with the initial bitstream;
operating the IC as configured with the initial bitstream;
in response to a reconfiguration trigger signal, configuring to a second state the respective partial configuration control memory cell coupled to one subset of the plurality of subsets of configuration memory cells of one frame of the one or more frames of configuration memory cells;
inputting a first partial bitstream that includes configuration data for at least the one frame of the one or more frames of configuration memory cells, wherein the first partial bitstream includes a quantity of configuration data for the plurality of subsets of configuration cells of the one frame;
enabling programming of the one subset of configuration memory cells with configuration data from the first partial bitstream in response to the respective partial configuration control memory cell being in the second state;

disabling programming of each other subset of the one frame other than the one subset of configuration memory cells of the one frame in response to the respective partial configuration control memory cell coupled to the other subset of configuration memory cells of the one frame being in the first state; and programming the one subset of configuration memory cells with configuration data from the first partial bitstream.

16. The method of claim 15, further comprising, after the programming of the configuration memory cells in the one subset of the one frame with configuration data from the partial bitstream, operating the programmable IC as configured with the first partial bitstream.

17. The method of claim 15, wherein the first partial bitstream includes filler data for configuration memory cells not in the one subset of the one frame.

* * * * *